(12) United States Patent
Chang et al.

(10) Patent No.: US 11,710,754 B2
(45) Date of Patent: Jul. 25, 2023

(54) SOLID-STATE IMAGE SENSOR INCLUDING MODULATION LAYER DECREASING PETAL FLARES

(71) Applicant: VisEra Technologies Company Limited, Hsin-Chu (TW)

(72) Inventors: Yu-Chi Chang, Hukou Township, Hsinchu County (TW); Pin-Chia Tseng, Hsinchu (TW); Zong-Ru Tu, Zhubei (TW)

(73) Assignee: VISERA TECHNOLOGIES COMPANY LIMIIED, Hsin-Chu (TW)

( * ) Notice: Subject to any disclaimer, the term of this patent is extended or adjusted under 35 U.S.C. 154(b) by 296 days.

(21) Appl. No.: 17/039,707

(22) Filed: Sep. 30, 2020

(65) Prior Publication Data
US 2022/0102412 A1  Mar. 31, 2022

(51) Int. Cl.
*H01L 27/146* (2006.01)
(52) U.S. Cl.
CPC .. *H01L 27/14625* (2013.01); *H01L 27/14621* (2013.01)
(58) Field of Classification Search
CPC ......... H01L 27/14621; H01L 27/14625; H01L 27/14643; H01L 27/14605; H01L 27/14627; H01L 27/1462; G02B 3/0037; G02B 5/20
USPC ........................ 257/257, 431; 250/208.1, 216
See application file for complete search history.

(56) References Cited

U.S. PATENT DOCUMENTS

| 5,764,822 A * | 6/1998 | Madabhushi ......... G02F 1/2255 385/39 |
| 9,117,717 B2 * | 8/2015 | Kokubun .......... H01L 27/14685 |
| 2014/0313350 A1 | 10/2014 | Keelan |

FOREIGN PATENT DOCUMENTS

| JP | 2018505617 A | 2/2018 |
| WO | WO-2019189099 A1 | 10/2019 |

* cited by examiner

*Primary Examiner* — Que Tan Le
*Assistant Examiner* — Mai Thi Ngoc Tran
(74) *Attorney, Agent, or Firm* — Muncy, Geissler, Olds & Lowe, P.C.

(57) ABSTRACT

A solid-state image sensor is provided. The solid-state image sensor includes a plurality of photoelectric conversion elements. The solid-state image sensor also includes a modulation layer disposed above the photoelectric conversion elements, and the modulation layer has a plurality of modulation segments. The modulation layer includes a plurality of first sub-layers and a plurality of second sub-layers having different refractive indexes. From the top view of the modulation layer, the modulation segments form a first group and a second group, and the second group is adjacent to the first group. The arrangement of the first sub-layers and the second sub-layers in the first group is different from the arrangement of the first sub-layers and the second sub-layers in the second group.

17 Claims, 8 Drawing Sheets

SOLID-STATE IMAGE SENSOR INCLUDING MODULATION LAYER DECREASING PETAL FLARES

BACKGROUND

Technical Field

The embodiments of the present disclosure relate to image sensors, and in particular they relate to solid-state image sensors including a modulation layer that may decrease petal flares.

Description of the Related Art

Solid-state image sensors (e.g., complementary metal-oxide semiconductor (CMOS) image sensors) have been widely used in various image-capturing apparatuses such as digital still-image cameras, digital video cameras, and the like. Signal electric charges may be generated according to the amount of light received in the light-sensing portion (e.g., photoelectric conversion element) of the solid-state image sensor. In addition, the signal electric charges generated in the light-sensing portion may be transmitted and amplified, whereby an image signal is obtained.

In traditional solid-state image sensors, it is easy to have grating diffraction issues (e.g., surface diffraction), which may cause the obtained image to have color dispersion (petal flares) and ghost images. Therefore, there are still various challenges to be overcome in the design of solid-state image sensors.

BRIEF SUMMARY

In some embodiments of the present disclosure, the solid-state image sensor includes a modulation layer, which may prevent surface diffraction, thereby improving the quality of the image signal from the photoelectric conversion elements of the solid-state image sensors.

In accordance with some embodiments of the present disclosure, a solid-state image sensor is provided. The solid-state image sensor includes a plurality of photoelectric conversion elements. The solid-state image sensor also includes a modulation layer disposed above the photoelectric conversion elements, and the modulation layer has a plurality of modulation segments. The modulation layer includes a plurality of first sub-layers and a plurality of second sub-layers having different refractive indexes. From the top view of the modulation layer, the modulation segments form a first group and a second group that is adjacent to the first group. The arrangement of the first sub-layers and the second sub-layers in the first group is different from the arrangement of the first sub-layers and the second sub-layers in the second group.

In some embodiments, from the top view of the modulation layer, each first sub-layer occupies one of the modulation segments, and each second sub-layer occupies another of the modulation segments.

In some embodiments, from the top view of the modulation layer, the first sub-layers are diagonally arranged, and the second sub-layers are diagonally arranged.

In some embodiments, from the top view of the modulation layer, each modulation segment includes one of the first sub-layers and one of the second sub-layers.

In some embodiments, from the top view of the modulation layer, each first sub-layer has a first width in a first direction and a second width in a second direction different from the first direction, each second sub-layer has a third width in the first direction and a fourth width in the second direction, and each modulation segment has a modulation width in the first direction and the second direction.

In some embodiments, from the top view of the modulation layer, the ratio of the first width to the modulation width or the ratio of the second width is larger than 0.25 and smaller than 1.

In some embodiments, from the top view of the modulation layer, the ratio of the third width to the modulation width or the ratio of the fourth width to the modulation width is larger than 0.25 and smaller than 1.

In some embodiments, from the top view of the modulation layer, the ratio of the first width to the modulation width and the ratio of the second width to the modulation width are larger than 0.25 and smaller than 1.

In some embodiments, from the top view of the modulation layer, the distance between the center of the first sub-layer and the center of the corresponding modulation segment is between 0 and 0.5 times the difference between the modulation width and the first width or between 0 and 0.5 times a difference between the modulation width and the second width.

In some embodiments, from the top view of the modulation layer, the shape of one of the first sub-layers and the second sub-layers is a triangle.

In some embodiments, from the top view of the modulation layer, the second group is adjacent to the first group in a first direction, the modulation segments also form a third group that is adjacent to the first group, and a fourth group that is adjacent to the second group in a second direction, and the second direction is different than the first direction.

In some embodiments, the arrangement of the first sub-layers and the second sub-layers in the third group is different from the arrangement of the first sub-layers and the second sub-layers in the first group.

In some embodiments, the arrangement of the first sub-layers and the second sub-layers in the fourth group is different from the arrangement of the first sub-layers and the second sub-layers in the second group.

In some embodiments, each of the first group and the second group includes n×m of the modulation segments, and m and n are positive integers that are greater than or equal to 2.

In some embodiments, in the cross-sectional view of the modulation layer, the ratio of the height of the first sub-layer to the height of each modulation segment or the ratio of the height of the second sub-layer to the height of each modulation segment is between 0.5 and 1.

In some embodiments, the solid-state image sensor further includes a color filter layer disposed between the photoelectric conversion elements and the modulation layer.

In some embodiments, the solid-state image sensor further includes a plurality of light-condensing structures disposed on the modulation layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
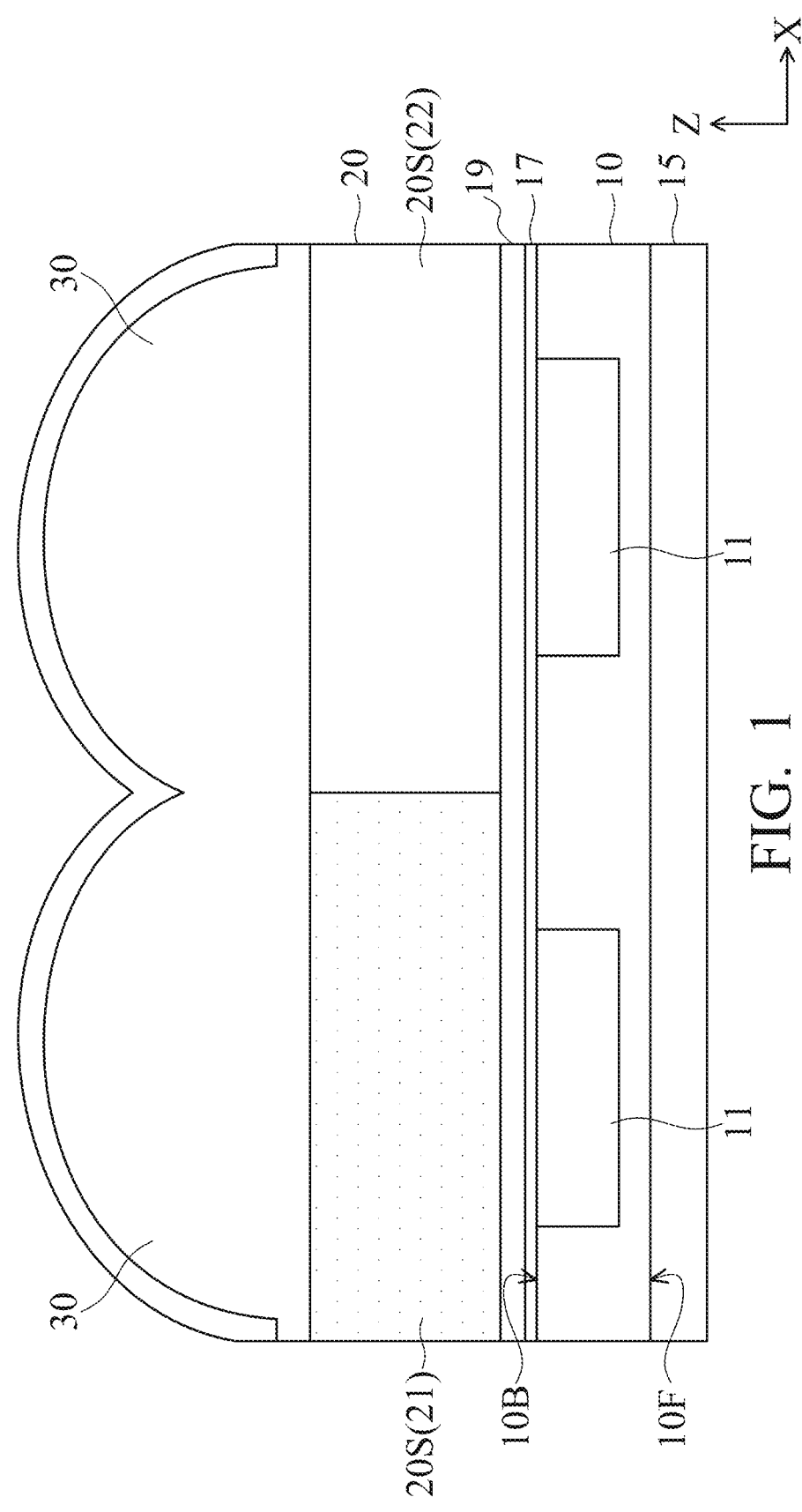
FIG. 1 is a partial cross-sectional view illustrating the solid-state image sensor in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +1-0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed.

FIG. 1 is a partial cross-sectional view illustrating the solid-state image sensor 100 in accordance with some embodiments of the present disclosure. It should be noted that some components of the solid-state image sensor 100 may be omitted in FIG. 1 for the sake of brevity. In some embodiments, the solid-state image sensor 100 may be a complementary metal-oxide semiconductor (CMOS) image sensor or a charge coupled device (CCD) image sensor, but the present disclosures is not limited thereto.

As shown in FIG. 1, a semiconductor substrate 10 which may be, for example, a wafer or a chip is provided. Referring to FIG. 1, the solid-state image sensor 100 includes a plurality of photoelectric conversion elements 11. The photoelectric conversion elements 11 may be, for example, photodiodes, and may be formed in the semiconductor substrate 10, but the present disclosures is not limited thereto.

In some embodiments, the photoelectric conversion elements 11 in the semiconductor substrate 10 may be isolated from each other by isolation structures (not shown) such as shallow trench isolation (STI) regions or deep trench isolation (DTI) regions. The isolation structures may be formed in the semiconductor substrate 10 using etching process to form trenches and filling the trenches with an insulating or dielectric material.

In some embodiments, the photoelectric conversion elements 11 are formed on the back surface 10B of the semiconductor substrate 10, and a wiring layer 15 is formed on the front surface 10F of the semiconductor substrate 10, but the present disclosure is not limited thereto. The wiring layer 15 may be an interconnect structure that includes multiple conductive lines and vias embedded in multiple dielectric layers, and may further include various electric circuits required for the solid-state image sensor 100. Incident lights may radiate onto the side of the back surface 10B and be received by the photoelectric conversion elements 11.

In this embodiment, incident lights radiate onto the side of the back surface 10B and are received by the photoelectric conversion elements 11. The solid-state imaging device 100 shown in FIG. 1 is referred to as a back-side illuminated (BSI) imaging device, but the present disclosure is not limited thereto. In some other embodiments, the solid-state imaging device may be a front-side illuminated (FSI) imaging device. The semiconductor substrate 10 and the wiring layer 15 shown in FIG. 1 may be inverted for FSI imaging device. In the FSI imaging device, incident lights radiate onto the side of the front surface 10F, pass through the wiring layer 15 and then are received by the photoelectric conversion elements 11 formed on the back surface 10B of the semiconductor substrate 10. The path of incident light passing through an FSI imaging device to reach the photoelectric conversion elements 11 is farther than that of a BSI imaging device.

As shown in FIG. 1, in some embodiments, a high dielectric-constant (high-κ) film 17 may be formed on the back surface 10B of the semiconductor substrate 10 and covering the photoelectric conversion elements 11. The material of the high-κ film 17 may include hafnium oxide ($HfO_2$), hafnium tantalum oxide (HfTaO), hafnium titanium oxide (HMO), hafnium zirconium oxide (HfZrO), tantalum pentoxide ($Ta_2O_5$), other suitable high-κ dielectric materials, or a combination thereof, but the present disclosure is not limited thereto. The high-κ film 17 may be formed by a deposition process. The deposition process is, for example, chemical vapor deposition (CVD), plasma enhanced chemical vapor deposition (PECVD), atomic layer deposition (ALD), or another deposition technique. The high-κ film 17 may have a high-refractive index and a light-absorbing ability.

As shown in FIG. 1, in some embodiments, a buffer layer 19 may be formed on the high-κ film 17. The material of the buffer layer 19 may include silicon oxides, silicon nitrides, silicon oxynitrides, other suitable insulating materials, or a combination thereof, but the present disclosure is not limited thereto. The buffer layer 19 may be formed by a deposition process. The deposition process is, for example, spin-on coating, chemical vapor deposition, flowable chemical vapor deposition (FCVD), plasma enhanced chemical vapor deposition, physical vapor deposition (PVD), or another deposition technique.

Referring to FIG. 1, the solid-state image sensor 100 includes a modulation layer 20 disposed above the photoelectric conversion elements 11. In the embodiment shown in FIG. 1, the modulation layer 20 may be disposed on the buffer layer 19. As shown in FIG. 1, the modulation layer 20 has (or may be divided into) a plurality of modulation segments 20S. In the embodiment shown in FIG. 1, each modulation segment 20S corresponds to one photoelectric conversion element 11, but the present disclosure is not limited thereto. In some other embodiments, each modulation segment 20S may correspond to at least two photoelectric conversion elements 11.

Moreover, the modulation layer 20 includes a plurality of first sub-layers 21 and a plurality of second sub-layers 22. In the embodiments of the present disclosure, the material of the first sub-layer 21 and the material of the second sub-layer 22 may include transparent material, and the first sub-layer 21 and the second sub-layer 22 have different refractive indexes. For example, the refractive index of the first sub-layer 21 may be between 1.5 and 2.0, and refractive index of the second sub-layer 22 may be between 1.0 and 2.0, but the present disclosure is not limited thereto. The modulation layer 20 may be formed by a deposition process. Examples of the deposition process are described above and will not be repeated here.

Referring to FIG. 1, the solid-state image sensor 100 may further include a plurality of light-condensing structures 30 disposed on the modulation layer 20. In some embodiments, the light-condensing structures 30 may be used for condensing incident light. In some embodiments, the material of the light-condensing structures 30 may include glass, epoxy resin, silicone resin, polyurethane, any other applicable material, or a combination thereof, but the present disclosure is not limited thereto. In some embodiments, the light-condensing structures 30 may be formed by a photoresist reflow method, a hot embossing method, any other applicable method, or a combination thereof, but the present disclosure is not limited thereto. In some embodiments, the steps of forming the light-condensing structures 30 may include a spin coating process, a lithography process, an etching process, any other applicable process, or a combination thereof, but the present disclosure is not limited thereto.

In some embodiments, the light-condensing structures 30 may be micro-lens structures, such as semi-convex lens structures or convex lens structures, but the present disclosure is not limited thereto. In some other embodiments, the light-condensing structures 30 may be micro-pyramid structures (e.g., circular cone, quadrangular pyramid, and so on), or they may be micro-trapezoidal structures (e.g., flat top cone, truncated square pyramid, and so on). Alternatively, the light-condensing structures 30 may be gradient-index structures.

In the embodiment shown in FIG. 1, each light-condensing structure 30 corresponds to one modulation segment 20S, but the present disclosure is not limited thereto. In some other embodiments, each light-condensing structure 30 may correspond to at least two modulation segments 20S.

Figure 2:
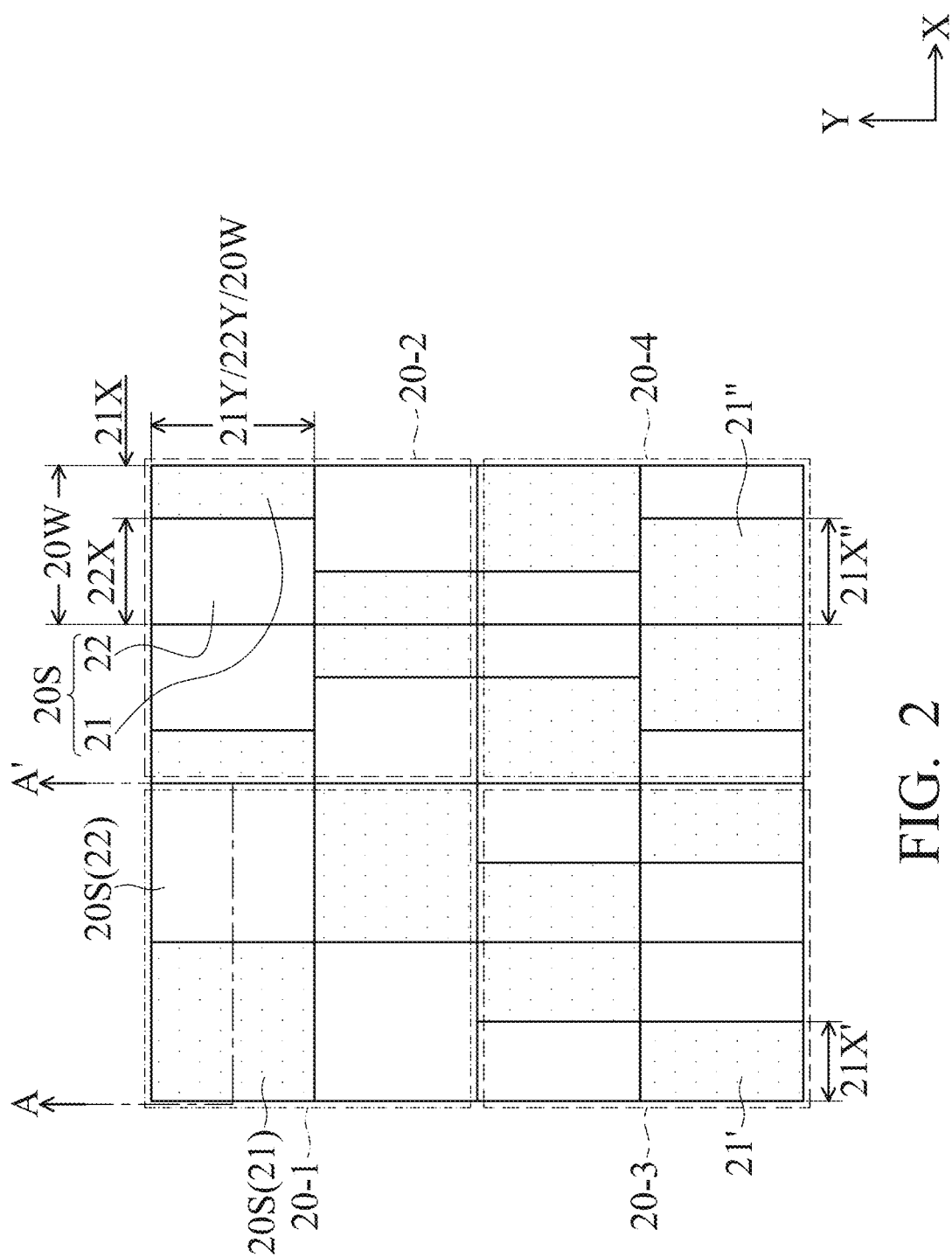
FIG. 2 is a partial top view illustrating the modulation layer in accordance with one embodiment of the present disclosure.

FIG. 2 is a partial top view illustrating the modulation layer 20 in accordance with one embodiment of the present disclosure. For example, the modulation layer 20 shown in FIG. 1 may be the partial cross-sectional view along line A-A' in FIG. 2, but the present disclosure is not limited thereto. Referring to FIG. 1 and FIG. 2, the modulation segments 20S form a first group 20-1 and a second group 20-2 adjacent to the first group 20-1 in the first direction (i.e., X-direction), and the arrangement of the first sub-layers 21 and the second sub-layers 22 in the first group 20-1 is different from the arrangement of the first sub-layers 21 and the second sub-layers 22 in the second group 20-2.

As shown in FIG. 2, in some embodiments (in the first group 20-1), each first sub-layer 21 may occupy one modulation segment 20S, and each second sub-layer 22 may occupy another modulation segment 20S. In more detail, the first group 20-1 includes four modulation segment 20S, two of the four modulation segment 20S are occupied by two first sub-layers 21, and another two of the four modulation segment 20S are occupied by two second sub-layers 22, but the present disclosure is not limited thereto. In some other embodiments, each modulation segment 20S may include both first sub-layer 21 and second sub-layer 22.

As shown in FIG. 2, in some embodiments (e.g., in the first group 20-1), the first sub-layers 21 may be diagonally arranged, and the second sub-layers 22 may be diagonally arranged, but the present disclosure is not limited thereto. In some other embodiments, first sub-layers 21 may be arranged adjacent to each other, and the second sub-layers 22 may be arranged adjacent to each other.

As shown in FIG. 2, in some embodiments (e.g., in the second group 20-2), each modulation segment 20S may include one of the first sub-layers 21 and one of the second sub-layers 22. In more detail, in the second group 20-2, each first sub-layer 21 has a first width 21X in the first direction (i.e., X-direction) and a second width 21Y in the second direction (Y-direction) that is different from the first direction, each second sub-layer 22 has a third width 22X in the first direction (i.e., X-direction) and a fourth width 22Y in the second direction (Y-direction), and each modulation segment 20S has a modulation width 20W in both first direction (i.e., X-direction) and second direction (Y-direction).

As shown in FIG. 2, in some embodiments (e.g., in the second group 20-2), the ratio of the first width 21X to the modulation width 20W may be larger than about 0.25 and smaller than about 1, the ratio of the third width 22X to the modulation width 20W may be larger than about 0.25 and smaller than about 1, and the second width 21Y, the fourth width 22Y, and the modulation width 20W may be the same, but the present disclosure is not limited thereto.

In some embodiments, the modulation layer 20 may be regarded as a color filter layer of the solid-state image sensor 100, but the present disclosure is not limited thereto. In some embodiments, the first group 20-1 and the second group 20-2 have different arrangements of the first sub-layers 21 and the second sub-layers 22, so that the first group 20-1 and the second group 20-2 may form a mosaic pattern. The mosaic pattern may cause phase modulation, which may prevent from generating surface diffraction, thereby improving the quality of the image signal from the photoelectric conversion elements 11 of the solid-state image sensors 100. In some embodiments, the modulation layer 20 may have a plurality of the mosaic patterns (i.e., a plurality of first groups 20-1 and second groups 20-2).

In some embodiments, as shown in FIG. 2, the second group 20-2 is adjacent to the first group 20-1 in the first direction (i.e., X-direction), and the modulation segments 20S may further form a third group 20-3 disposed adjacent to the first group 20-1 and a fourth group 20-4 disposed adjacent to the second group 20-2 in the second direction (i.e., Y-direction).

In some embodiments, the arrangement of the first sub-layers 21 and the second sub-layers 22 in the third group 20-3 is different from the arrangement of the first sub-layers 21 and the second sub-layers 22 in the first group 20-1, and from the arrangement of the first sub-layers 21 and the second sub-layers 22 in the second group 20-2, but the present disclosure is not limited thereto. For example, the first width 21X' of the first sub-layer 21' in the third group 20-3 may be larger than the first width 21X of the first sub-layer 21 in the second group 20-2, but the present disclosure is not limited thereto.

In some embodiments, the arrangement of the first sub-layers 21 and the second sub-layers 22 in the fourth group 20-4 is different from the arrangement of the first sub-layers 21 and the second sub-layers 22 in the first group 20-1, from the arrangement of the first sub-layers 21 and the second sub-layers 22 in the second group 20-2, and from the arrangement of the first sub-layers 21 and the second sub-layers 22 in the third group 20-3. For example, the first width 21X" of the first sub-layer 21" in the fourth group 20-4 may be larger than the first width 21X' of the first sub-layer 21' in the third group 20-3, but the present disclosure is not limited thereto.

Similarly, in some embodiments, the first group 20-1, the second group 20-2, the third group 20-3, and the fourth group 20-4 have different arrangements of the first sub-layers 21 and the second sub-layers 22, so that the first group 20-1, the second group 20-2, the third group 20-3, and the fourth group 20-4 may form a mosaic pattern. The mosaic pattern may cause phase modulation, which may prevent from generating surface diffraction, thereby improving the quality of the image signal from the photoelectric conversion elements 11 of the solid-state image sensors 100. In some embodiments, the modulation layer 20 may have a plurality of the mosaic patterns (i.e., a plurality of the first groups 20-1, second groups 20-2, third groups 20-3, and fourth groups 20-4).

Figure 3:
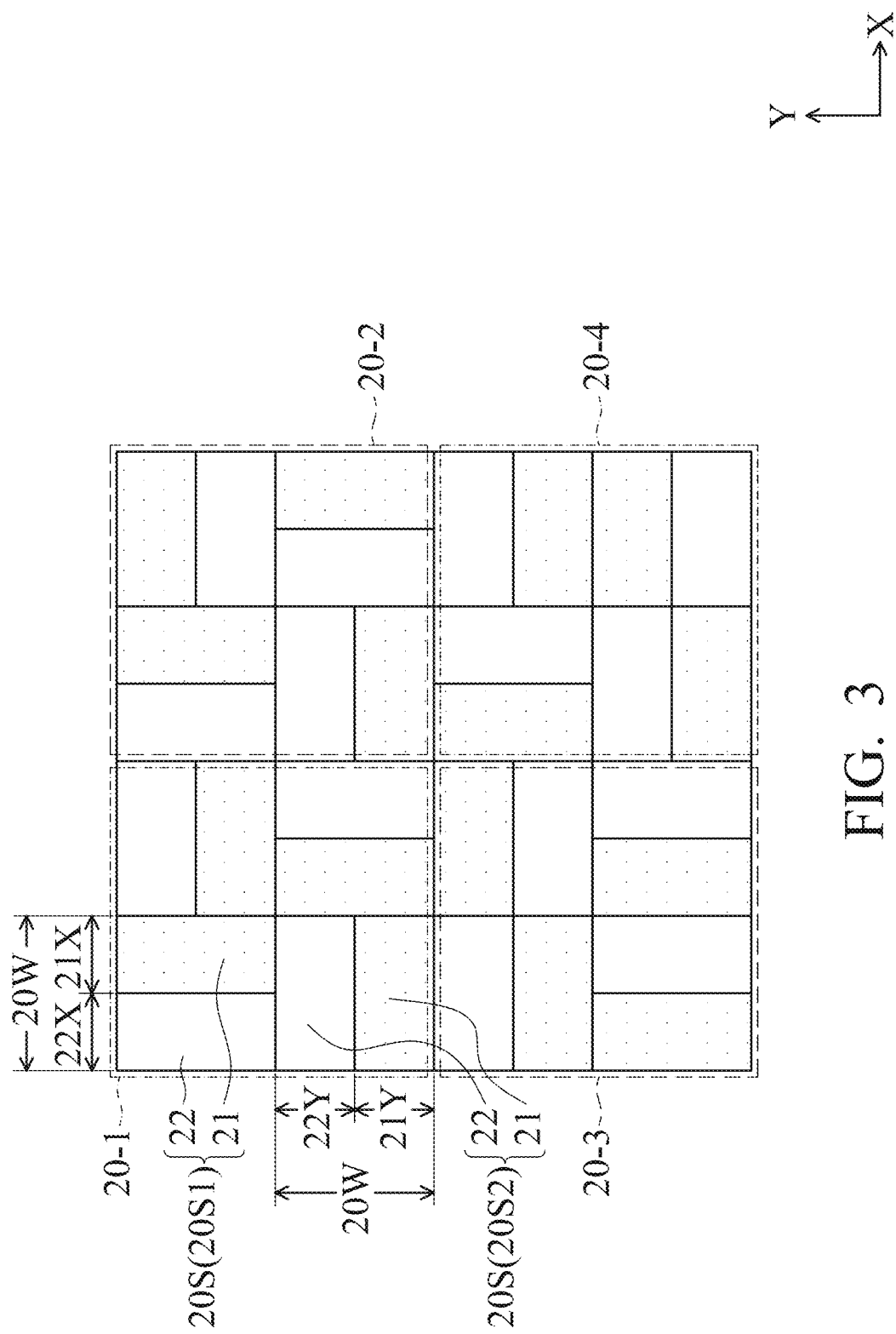
FIG. 3 is a partial top view illustrating the modulation layer in accordance with another embodiment of the present disclosure.

FIG. 3 is a partial top view illustrating the modulation layer 20 in accordance with another embodiment of the present disclosure. Similarly, the modulation segments 20S may form a first group 20-1, a second group 20-2, a third group 20-3, and a fourth group 20-4. As shown in FIG. 3, the second group 20-2 is disposed adjacent to the first group 20-1 in the first direction (i.e., X-direction), the third group 20-3 is disposed adjacent to the first group 20-1 in the second direction (i.e., Y-direction), and the fourth group 20-4 is disposed adjacent to the second group 20-2 in the second direction (i.e., Y-direction).

As shown in FIG. 3, in some modulation segments 20S (e.g., modulation segments 20S1), the ratio of the first width 21X to the modulation width 20W may be larger than about 0.25 and smaller than about 1, the ratio of the third width 22X to the modulation width 20W may be larger than about 0.25 and smaller than about 1, and the second width 21Y, the fourth width 22Y, and the modulation width 20W may be the same. In other modulation segments 20S (e.g., modulation segment 20S2), the first width 21X, the third width 22X, and the modulation width 20W may be the same, the ratio of the second width 21Y to the modulation width 20W may be larger than about 0.25 and smaller than about 1, and the ratio of the fourth width 22Y to the modulation width 20W may be larger than about 0.25 and smaller than about 1.

Figure 4:
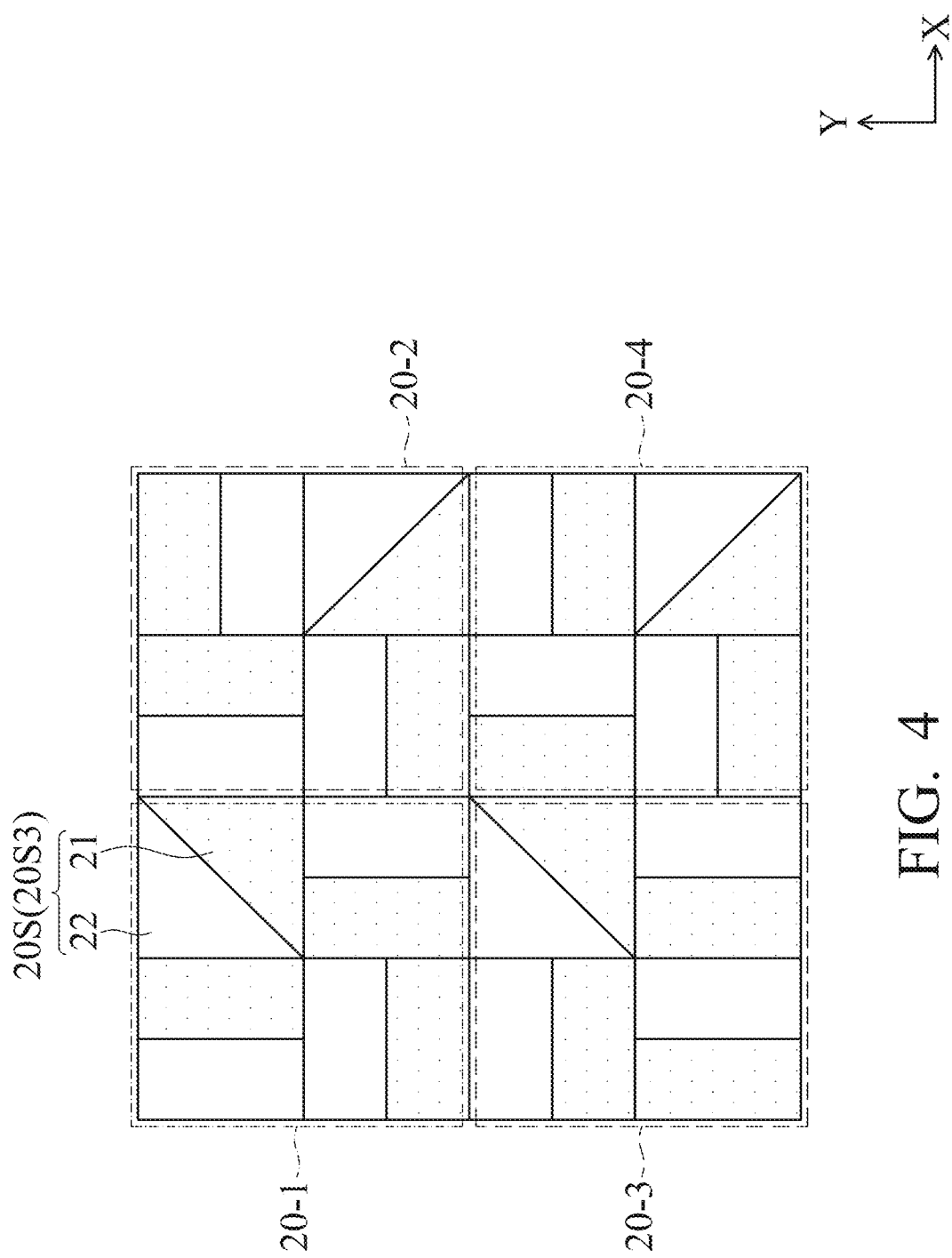
FIG. 4 is a partial top view illustrating the modulation layer in accordance with another embodiment of the present disclosure.

FIG. 4 is a partial top view illustrating the modulation layer 20 in accordance with another embodiment of the present disclosure. Similarly, the modulation segments 20S may form a first group 20-1, a second group 20-2, a third group 20-3, and a fourth group 20-4. As shown in FIG. 4 the second group 20-2 is disposed adjacent to the first group 20-1 in the first direction (i.e., X-direction), the third group 20-3 is disposed adjacent to the first group 20-1 in the second direction (i.e., Y-direction), and the fourth group 20-4 is disposed adjacent to the second group 20-2 in the second direction (i.e., Y-direction).

As shown in FIG. 4, in some modulation segments 20S (e.g., modulation segments 20S3), the first sub-layer 21 and/or the second sub-layer 22 may be formed as a triangle, but the present disclosure is not limited thereto. In some other embodiments, the first sub-layer 21 and/or the second sub-layer 22 may be formed as another kind of polygons (e.g., pentagons), a circle or an irregular shape.

In the foregoing embodiments, the first group 20-1, the second group 20-2, the third group 20-3, and the fourth group 20-4 each includes 2×2 of modulation segments, but the present disclosure is not limited thereto.

Figure 5:
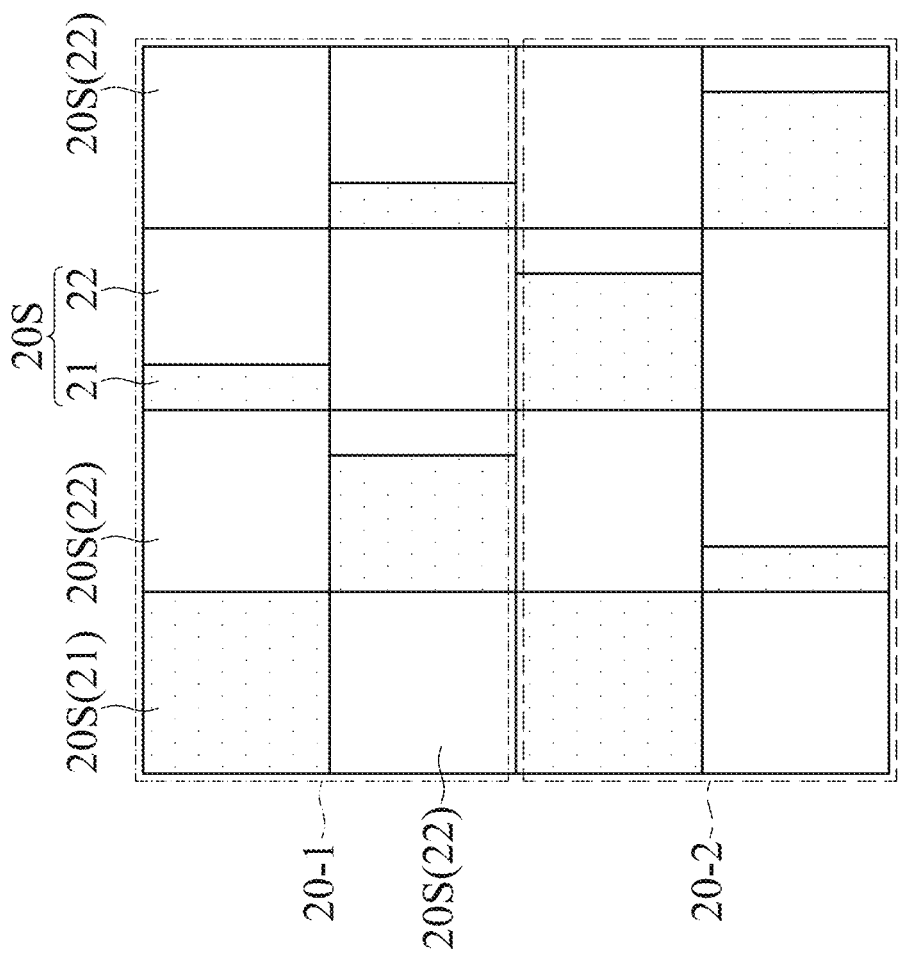
FIG. 5 is a partial top view illustrating the modulation layer in accordance with another embodiment of the present disclosure.

FIG. 5 is a partial top view illustrating the modulation layer 20 in accordance with another embodiment of the present disclosure. In this embodiment, the modulation segments 20S may form a first group 20-1 and a second group 20-2. As shown in FIG. 5 the second group 20-2 is disposed adjacent to the first group 20-1 in the second direction (i.e., Y-direction).

In the embodiment shown in FIG. 5, the first group 20-1 and the second group 20-2 each includes 4×2 of modulation segments, but the present disclosure is not limited thereto. In some embodiments, the first group 20-1 and the second group 20-2 (and/or the third group 20-3, the fourth group 20-4) each may include n×m of modulation segments, and m and n are positive integers that are greater than or equal to 2.

Figure 6:
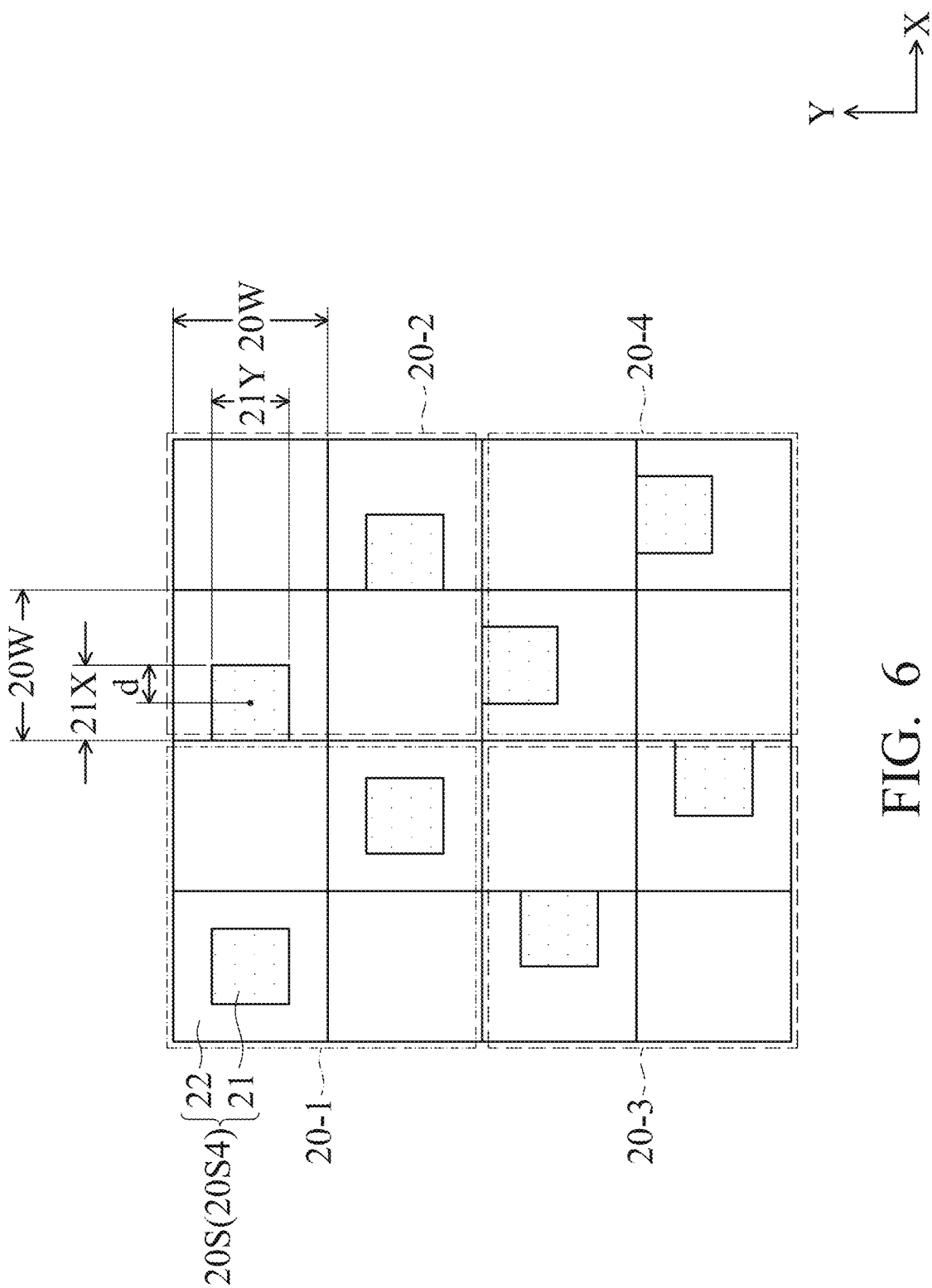
FIG. 6 is a partial top view illustrating the modulation layer in accordance with another embodiment of the present disclosure.

FIG. 6 is a partial top view illustrating the modulation layer 20 in accordance with another embodiment of the present disclosure. Similarly, the modulation segments 20S may form a first group 20-1, a second group 20-2, a third group 20-3, and a fourth group 20-4. As shown in FIG. 6, the second group 20-2 is disposed adjacent to the first group 20-1 in the first direction (i.e., X-direction), the third group 20-3 is disposed adjacent to the first group 20-1 in the second direction (i.e., Y-direction), and the fourth group 20-4 is disposed adjacent to the second group 20-2 in the second direction (i.e., Y-direction).

As shown in FIG. 6, in some modulation segments 20S (e.g., modulation segments 20S4), both the ratio of first width 21X to the modulation width 20W and the ratio of second width 21Y to the modulation width 20W may be larger than about 0.25 and smaller than about 1. In this embodiment, the first sub-layer 21 in the modulation segment 20S4 may be formed as a rectangle (i.e., the first width 21X is equal to the second width 21Y), but the present disclosure is not limited thereto.

In some embodiments, the distance d between the center of the first sub-layer 21 and the center of the modulation segment 20S4 may be between 0 and 0.5 times the difference between the modulation width 20W and the first width 21X or the second width 21Y (i.e., 0<d<(20W−21X)/2 or 0<d< (20W−21Y)/2). That is, the center of the first sub-layer 21 in the modulation segment 20S4 may have an extra-shift with respect to the center of the corresponding photoelectric conversion element 11, but the present disclosure is not limited thereto.

Figure 7:
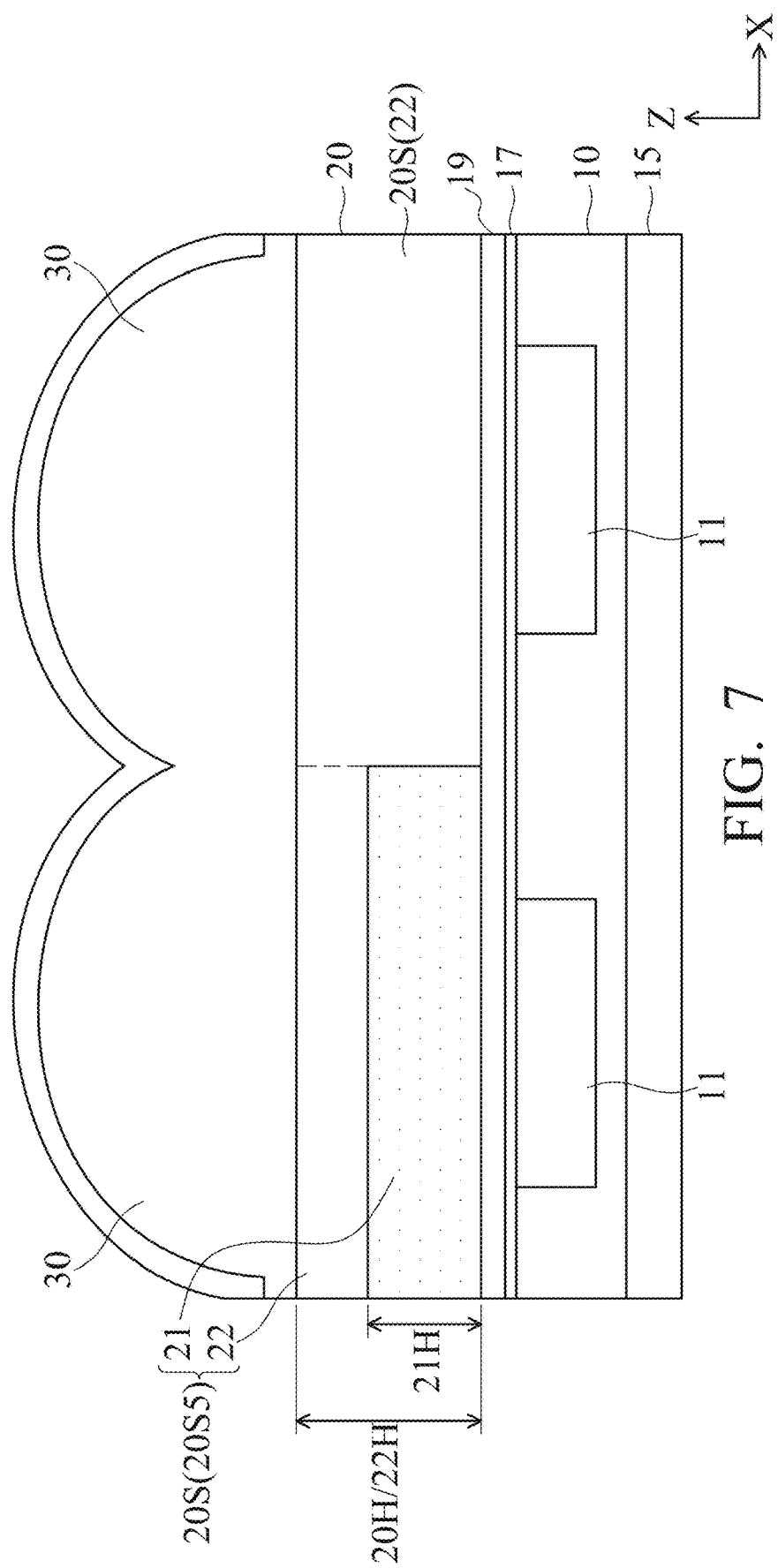
FIG. 7 is a partial cross-sectional view illustrating the solid-state image sensor in accordance with some embodiments of the present disclosure.

FIG. 7 is a partial cross-sectional view illustrating the solid-state image sensor 102 in accordance with some embodiments of the present disclosure. Similarly, some components of the solid-state image sensor 102 may be omitted in FIG. 7 for the sake of brevity.

The solid-state image sensor 102 shown in FIG. 7 has a similar structure to the solid-state image sensor 100 shown in FIG. 1. As shown in FIG. 7, the difference from the solid-state image sensor 100 shown in FIG. 1 is that in some modulation segments 20S (e.g., modulation segments 20S5) of the solid-state image sensor 102, the height 21H of the first sub-layer 21 may be less than the height 20H of the modulation segment 20S, and the height 22H of the second sub-layer 22 may be equal to the height 20H of the modulation segment 20S, but the present disclosure is not limited thereto. In some other embodiments, the height 22H of the second sub-layer 22 may be less than the height 20H of the modulation segment 20S, and the height 21H of the first sub-layer 21 may be equal to the height 20H of the modulation segment 20S.

In some embodiments, the ratio of the height 21H of the first sub-layer 21 to the height 20H of the modulation segment 20H (or the ratio of the height 22H of the second sub-layer 22 to the height 20H of the modulation segment 20H) may be between about 0.5 and about 1, but the present disclosure is not limited thereto.

Figure 8:
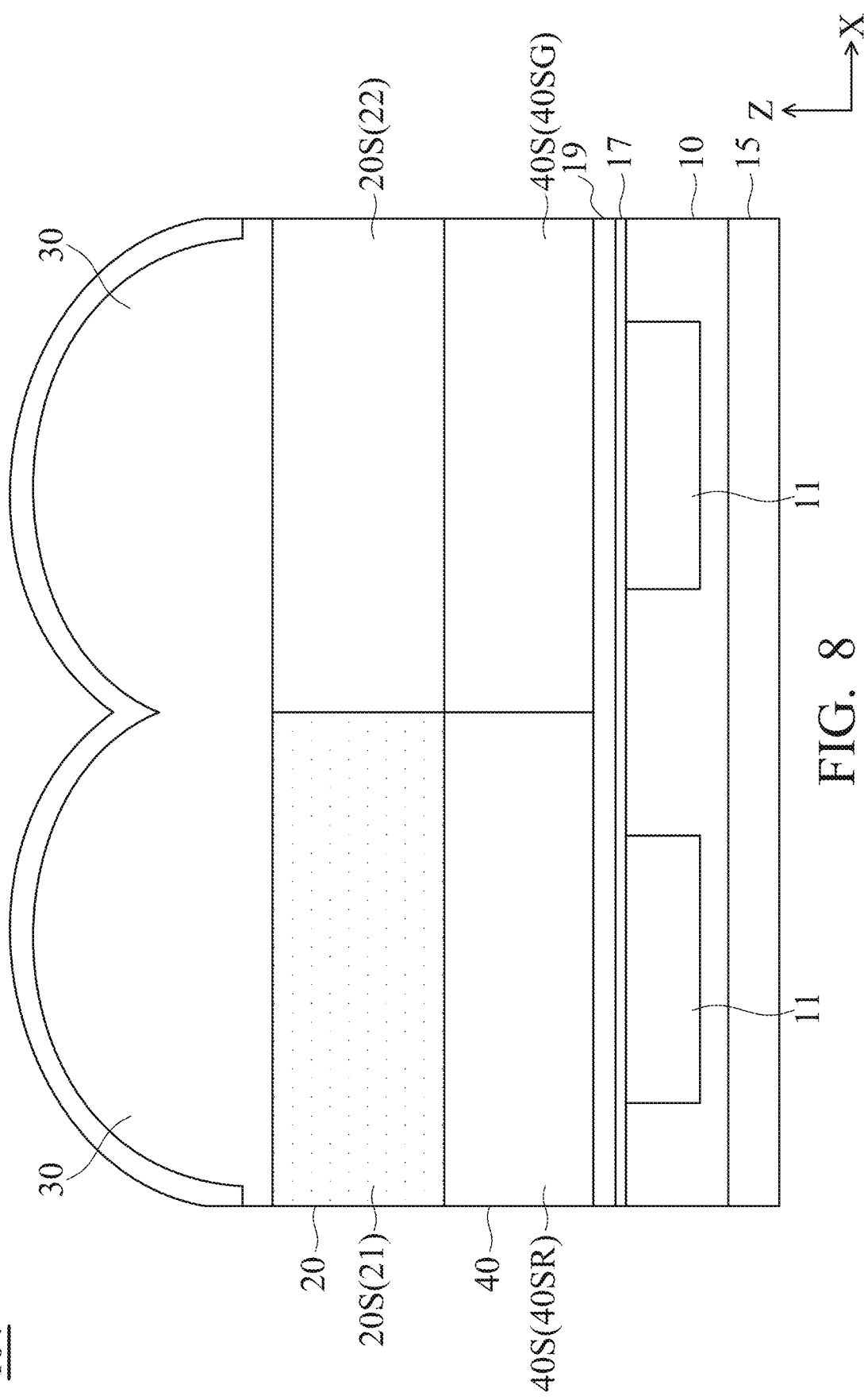
FIG. 8 is a partial cross-sectional view illustrating the solid-state image sensor in accordance with some embodiments of the present disclosure.

FIG. 8 is a partial cross-sectional view illustrating the solid-state image sensor 104 in accordance with some embodiments of the present disclosure. Similarly, some components of the solid-state image sensor 104 may be omitted in FIG. 8 for the sake of brevity.

The solid-state image sensor 104 shown in FIG. 8 has a similar structure to the solid-state image sensor 100 shown in FIG. 1. As shown in FIG. 8, the difference from the solid-state image sensor 100 shown in FIG. 1 is that the solid-state image sensor 104 may further include a color filter layer 40 disposed between the photoelectric conversion elements 11 and the modulation layer 20.

As shown in FIG. 8, the color filter layer 40 may have a plurality of color filter segments 40S. The color filter segments 40S may correspond to the same color or different colors. For example, in the embodiment shown in FIG. 8, one of the color filter segments 40S may be a red color filter segment (i.e., color filter segment 40SR), and another of the color filter segments 40S may be a green color filter segment (i.e., color filter segment 40SG), but the present disclosure is not limited thereto. In some other embodiments, the color filter segments 40S may include a blue color filter segment, a white color filter segment, and so on.

In summary, according to the embodiments of the present disclosure, the solid-state image sensor includes a modulation layer, and the modulation layer has a plurality of modulation segments that may form at least two groups (e.g., the first group and the second group) from a top view of the modulation layer. These groups may have different arrangements of two sub-layers that have different refractive indexes, thereby forming a mosaic pattern. The mosaic pattern may cause phase modulation, which may prevent from generating surface diffraction, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A solid-state image sensor, comprising:
   a plurality of photoelectric conversion elements; and
   a modulation layer disposed above the plurality of photoelectric conversion elements, and having a plurality of modulation segments;

wherein the modulation layer comprises a plurality of first sub-layers and a plurality of second sub-layers deposited on a same horizontal level above the plurality of photoelectric conversion elements and having different refractive indexes, each of the plurality of modulation segments includes one of the plurality of first sub-layers and one of the plurality of second sub-layers, from a top view of the modulation layer, the plurality of modulation segments form a first group and a second group that is adjacent to the first group, and a horizontal pattern of the plurality of first sub-layers and the plurality of second sub-layers in the first group is different from a horizontal pattern of the plurality of first sub-layers and the plurality of second sub-layers in the second group.

2. The solid-state image sensor as claimed in claim 1, wherein from the top view of the modulation layer, each of the plurality of first sub-layers occupies one of the plurality of modulation segments, and each of the plurality of second sub-layers occupies another of the plurality of modulation segments.

3. The solid-state image sensor as claimed in claim 2, wherein from the top view of the modulation layer, the plurality of first sub-layers are diagonally arranged, and the plurality of second sub-layers are diagonally arranged.

4. The solid-state image sensor as claimed in claim 1, wherein from the top view of the modulation layer, each of the plurality of modulation segments comprises one of the plurality of first sub-layers and one of the plurality of second sub-layers.

5. The solid-state image sensor as claimed in claim 4, wherein from the top view of the modulation layer, each of the plurality of first sub-layers has a first width in a first direction and a second width in a second direction different from the first direction, each of the plurality of second sub-layers has a third width in the first direction and a fourth width in the second direction, and each of the plurality of modulation segments has a modulation width in the first direction and the second direction.

6. The solid-state image sensor as claimed in claim 5, wherein from the top view of the modulation layer, a ratio of the first width to the modulation width or a ratio of the second width to the modulation width is larger than 0.25 and smaller than 1.

7. The solid-state image sensor as claimed in claim 5, wherein from the top view of the modulation layer, a ratio of the third width to the modulation width or a ratio of the fourth width to the modulation width is larger than 0.25 and smaller than 1.

8. The solid-state image sensor as claimed in claim 5, wherein from the top view of the modulation layer, both a ratio of the first width to the modulation width and a ratio of the second width to the modulation width are larger than 0.25 and smaller than 1.

9. The solid-state image sensor as claimed in claim 5, wherein from the top view of the modulation layer, a distance between a center of one of the plurality of first sub-layers and a center of a corresponding one of the modulation segments is between 0 and 0.5 times a difference distance between the modulation width and the first width or between 0 and 0.5 times a difference distance between the modulation width and the second width.

10. The solid-state image sensor as claimed in claim 4, wherein from the top view of the modulation layer, a shape of one of the plurality of first sub-layers and the plurality of second sub-layers is a triangle.

11. The solid-state image sensor as claimed in claim 1, wherein from the top view of the modulation layer, the second group is adjacent to the first group in a first direction, the plurality of modulation segments further form a third group that is adjacent to the first group and a fourth group that is adjacent to the second group in a second direction, and the second direction is different from the first direction.

12. The solid-state image sensor as claimed in claim 11, wherein a horizontal pattern of the plurality of first sub-layers and the plurality of second sub-layers in the third group is different from a horizontal pattern of the plurality of first sub-layers and the plurality of second sub-layers in the first group.

13. The solid-state image sensor as claimed in claim 11, wherein a horizontal pattern of the plurality of first sub-layers and the plurality of second sub-layers in the fourth group is different from a horizontal pattern of the plurality of first sub-layers and the plurality of second sub-layers in the second group.

14. The solid-state image sensor as claimed in claim 1, wherein each of the first group and the second group includes n×m of the plurality of modulation segments, and m and n are positive integers that are greater than or equal to 2.

15. The solid-state image sensor as claimed in claim 1, wherein in a cross-sectional view of the modulation layer, a ratio of a height of one of the plurality of first sub-layers to a height of each of the plurality of modulation segments or a ratio of a height of one of the plurality of second sub-layers to the height of each of the plurality of modulation segments is between 0.5 and 1.

16. The solid-state image sensor as claimed in claim 1, further comprising:
a color filter layer disposed between the plurality of photoelectric conversion elements and the modulation layer.

17. The solid-state image sensor as claimed in claim 1, further comprising:
a plurality of light-condensing structures disposed on the modulation layer.

* * * * *